United States Patent
Kang et al.

(10) Patent No.: US 10,665,657 B2
(45) Date of Patent: May 26, 2020

(54) DISPLAY APPARATUS

(71) Applicant: Samsung Display Co., Ltd., Yongin-Si, Gyeonggi-Do (KR)

(72) Inventors: Chulkyu Kang, Yongin-si (KR); Kiwook Kim, Yongin-si (KR); Jinwoo Park, Yongin-si (KR); Dongsun Lee, Yongin-si (KR); Sangmoo Choi, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/275,192

(22) Filed: Feb. 13, 2019

(65) Prior Publication Data

US 2019/0252479 A1 Aug. 15, 2019

(30) Foreign Application Priority Data

Feb. 13, 2018 (KR) .................... 10-2018-0018063

(51) Int. Cl.
*H01L 27/32* (2006.01)
*H01L 27/12* (2006.01)
*H01L 29/786* (2006.01)

(52) U.S. Cl.
CPC ...... *H01L 27/3262* (2013.01); *H01L 27/3265* (2013.01); *H01L 27/3276* (2013.01); *H01L 27/124* (2013.01); *H01L 27/1225* (2013.01); *H01L 27/1251* (2013.01); *H01L 27/1255* (2013.01); *H01L 29/7869* (2013.01); *H01L 29/78675* (2013.01)

(58) Field of Classification Search
None
See application file for complete search history.

(56) References Cited

U.S. PATENT DOCUMENTS 8,766,963 B2   7/2014   Lee et al.
9,620,534 B2   4/2017   Yang et al.
(Continued)

FOREIGN PATENT DOCUMENTS

KR   10-0822205 B1   4/2008
KR   10-1329964 B1   11/2013
(Continued)

OTHER PUBLICATIONS

Keum, Nack-Hyeon, et al. "A Compensation Method for Variations in Subthreshold Slope and Threshold Voltage of Thin-Film Transistors for AMOLED Displays." IEEE Journal of the Electron Devices Society, vol. 7, 2019, pp. 462-469., doi:10.1109/jeds.2019.2904852. (Year: 2019).*

*Primary Examiner* — J. E. Schoenholtz

(74) *Attorney, Agent, or Firm* — Innovation Counsel LLP

(57) ABSTRACT

A display apparatus may include a first transistor, a second transistor, and a capacitor. The first transistor includes a first semiconductor layer and a first gate electrode insulated from the first semiconductor layer. The first semiconductor layer includes a first silicon semiconductor. The second transistor includes a second semiconductor layer and a second gate electrode insulated from the second semiconductor layer. The second semiconductor layer includes a first oxide semiconductor. The capacitor includes a first electrode and a second electrode. The second electrode overlaps the first electrode and extends from the second semiconductor layer.

20 Claims, 6 Drawing Sheets

(56) References Cited

U.S. PATENT DOCUMENTS

2016/0111450 A1  4/2016 Shen et al.
2017/0249896 A1  8/2017 Kim et al.
2017/0294497 A1* 10/2017 Lius .................... H01L 27/1255
2017/0365214 A1* 12/2017 Tsai ..................... G09G 3/3233

FOREIGN PATENT DOCUMENTS

KR  10-2016-0049381    5/2016
KR  10-2017-0102147 A  9/2017

* cited by examiner

DISPLAY APPARATUS

CROSS-REFERENCE TO RELATED APPLICATION

This application claims priority to and the benefit of Korean Patent Application No. 10-2018-0018063, filed on Feb. 13, 2018, in the Korean Intellectual Property Office; the disclosure of the Korean Patent Application is incorporated herein in its entirety by reference.

BACKGROUND

1. Field

The technical field relates to a display apparatus.

2. Description of the Related Art

A display apparatus typically includes a display device and a driving circuit for controlling electrical signals applied to the display device. The driving circuit may include thin-film transistors (TFTs) and wirings.

In the driving circuit, a significant number of TFTs may be required in order to precisely control light emission of the display device. The TFTs may incur significant integration issues and power consumption.

SUMMARY

One or more example embodiments may be related to a display apparatus including and/or driven by both a thin-film transistor (TFT) including a silicon semiconductor and a TFT including an oxide semiconductor. Advantageously, power consumption of the display apparatus may be minimized, and the display apparatus may be highly integrated.

According to one or more example embodiments, a display apparatus includes the following elements: a first thin-film transistor (TFT) including a first semiconductor layer including a silicon semiconductor and a first gate electrode insulated from the first semiconductor layer; a fourth TFT including a fourth semiconductor layer including an oxide semiconductor and a fourth gate electrode insulated from the fourth semiconductor layer; and a capacitor including a lower electrode and an upper electrode extending from the fourth semiconductor layer.

The lower electrode of the capacitor may be arranged on same layer as the first gate electrode, and the upper electrode of the capacitor may be connected to the first gate electrode.

The display apparatus may further include: a connection electrode configured to contact an upper surface of the first gate electrode and an upper surface of the upper electrode of the capacitor.

The display apparatus may further include: a second TFT including a second semiconductor layer including a silicon semiconductor and a second gate electrode insulated from the second semiconductor layer, and configured to transmit a data signal to the first TFT; and a first signal line connected to the second gate electrode.

The lower electrode of the capacitor may be connected to the first signal line.

The lower electrode of the capacitor may include an area protruding from a portion of the first signal line.

The display apparatus may further include: a third TFT including a third semiconductor layer including an oxide semiconductor and a third gate electrode insulated from the third semiconductor layer, and the third TFT being connected to the first gate electrode and the first semiconductor layer; and a second signal line connected to the third gate electrode.

The first signal line and the second signal line may be apart from each other in a first direction, and the first TFT may be between the first signal line and the second signal line in a plan view.

The first signal line and the second signal line may be arranged in different layers.

One end of the third semiconductor layer connected to the first gate electrode may be electrically connected to the upper electrode of the capacitor.

The display apparatus may further include: a seventh TFT including a seventh semiconductor layer including a silicon semiconductor and a seventh gate electrode insulated from the seventh semiconductor layer, wherein the seventh gate electrode is connected to the first signal line.

The fourth TFT may apply an external voltage to the first gate electrode.

The fourth semiconductor layer may be arranged on an upper layer of the first semiconductor layer.

According to one or more example embodiments, a display apparatus includes the following elements: a first thin-film transistor (TFT) including a first semiconductor layer and a first gate electrode insulated from the first semiconductor layer; a fourth TFT including a fourth semiconductor layer and a fourth gate electrode insulated from the fourth semiconductor layer; and a capacitor including a lower electrode and an upper electrode connected to the fourth semiconductor layer and including an oxide semiconductor.

The display apparatus may further include: a connection electrode configured to contact an upper surface of the first gate electrode and an upper surface of the upper electrode of the capacitor.

The first semiconductor layer may include a silicon semiconductor, and the fourth semiconductor layer may include an oxide semiconductor.

The display apparatus may further include: a second TFT including a second semiconductor layer and a second gate electrode insulated from the second semiconductor layer, and configured to transmit a data signal to the first TFT; a first signal line connected to the second gate electrode; a third TFT including a third semiconductor layer and a third gate electrode insulated from the third semiconductor layer, the third TFT being connected to the first gate electrode and the first semiconductor layer; and a second signal line connected to the third gate electrode.

The first signal line and the second signal line may be apart from each other in a first direction, and the first TFT may be between the first signal line and the second signal line in a plan view.

The display apparatus may further include: a seventh TFT including a seventh semiconductor layer and a seventh gate electrode insulated from the seventh semiconductor layer, wherein the seventh gate electrode may be connected to the first signal line.

The seventh semiconductor layer may include a silicon semiconductor.

An embodiment may be related to a display apparatus. The display apparatus may include a first transistor (e.g., T1 discussed with reference to drawings), a second transistor (e.g., T4 discussed with reference to drawings), and a capacitor (e.g., Cb discussed with reference to drawings). The first transistor may include a first semiconductor layer and a first gate electrode insulated from the first semiconductor layer. The first semiconductor layer may include a first silicon semiconductor. The second transistor may include a second semiconductor layer and a second gate electrode insulated from the second semiconductor layer. The second semiconductor layer may include a first oxide semiconductor different from the first silicon semiconductor. The capacitor may include a first electrode and a second electrode. The second electrode overlaps the first electrode and may extend from the second semiconductor layer. The second electrode and the second semiconductor layer may contact a same face of a same insulating layer.

The display apparatus may include a first insulating layer and a second insulating layer overlapping the first insulating layer. The first electrode of the capacitor and the first gate electrode may both contact the first insulating layer and the second insulating layer and may be both positioned between the first insulating layer and the second insulating layer. The second electrode of the capacitor may be electrically connected to the first gate electrode.

The display apparatus may include a connection electrode contacting a face of the first gate electrode and contacting a face of the second electrode of the capacitor. The face of the first gate electrode and the face of the second electrode of the capacitor may face a same direction (toward the connection electrode).

The display apparatus may include a third transistor (e.g., T2 discussed with reference to drawings) and a first signal line. The third transistor may include a third semiconductor layer, may include a third gate electrode insulated from the third semiconductor layer, and may transmit a data signal to the first transistor. The third semiconductor layer may include a second silicon semiconductor. The first signal line may be electrically connected to the third gate electrode.

The first electrode of the capacitor may be electrically connected to the first signal line.

The first electrode of the capacitor may include a protruding portion of the first signal line.

The display apparatus may include a fourth transistor (e.g.; T3 discussed with reference to drawings) and a second signal line. The fourth transistor may include a fourth semiconductor layer, may include a fourth gate electrode insulated from the fourth semiconductor layer, and may be electrically connected to the first gate electrode and the second semiconductor layer. The fourth semiconductor layer may include a second oxide semiconductor. The second signal line may be electrically connected to the fourth gate electrode.

The first signal line and the second signal line may be apart from each other in a first direction. The first transistor may be between the first signal line and the second signal line in a plan view of the display apparatus.

The first signal line and the second signal line respectively contact different insulating layers.

The fourth semiconductor layer may be electrically connected to both the first gate electrode and the second electrode of the capacitor.

The display apparatus may include a fifth transistor (e.g., T7 discussed with reference to drawings). The fifth transistor may include a fifth semiconductor layer and a fifth gate electrode insulated from the fifth semiconductor layer. The fifth semiconductor layer may include a third silicon semiconductor. The fifth gate electrode may be electrically connected to the first signal line.

The second transistor may apply an external voltage to the first gate electrode.

The first gate electrode may be positioned between the second semiconductor layer and the first semiconductor layer.

An embodiment may be related to a display apparatus. The display apparatus may include a first transistor (e.g., T1 discussed with reference to drawings), a second transistor (e.g., T4 discussed with reference to drawings), and a capacitor (e.g., Cb discussed with reference to drawings). The first transistor may include a first semiconductor layer and a first gate electrode insulated from the first semiconductor layer. The second transistor may include a second semiconductor layer and a second gate electrode insulated from the second semiconductor layer. A material of the second semiconductor layer may be different from a material of the first semiconductor layer. The capacitor may include a first electrode and a second electrode. The second electrode may overlap the first electrode, may be electrically connected to the second semiconductor layer, and may include a first oxide semiconductor.

The display apparatus may include a connection electrode contacting both a face of the first gate electrode and a face of the second electrode of the capacitor. The face of the first gate electrode and the face of the second electrode of the capacitor may face a same direction.

The first semiconductor layer may include a silicon semiconductor. The second semiconductor layer comprises a second oxide semiconductor. A composition of the second oxide semiconductor may be identical to a composition of the first oxide semiconductor.

The display apparatus may include a third transistor (e.g., T2 discussed with reference to drawings), a first signal line, a fourth transistor (e.g., T3 discussed with reference to drawings), and a second signal line. The third transistor may include a third semiconductor layer, may include a third gate electrode insulated from the third semiconductor layer, and may transmit a data signal to the first transistor. The first signal line may be electrically connected to the third gate electrode. The fourth transistor may include a fourth semiconductor layer, may include a fourth gate electrode insulated from the fourth semiconductor layer, and may be electrically connected to both the first gate electrode and the first semiconductor layer. The second signal line may be electrically connected to the fourth gate electrode.

The first signal line and the second signal line may be apart from each other in a first direction. The first transistor may be between the first signal line and the second signal line in a plan view of the display apparatus.

The display apparatus may include a fifth transistor (e.g., T7 discussed with reference to drawings). The fifth transistor may include a fifth semiconductor layer and a fifth gate electrode insulated from the fifth semiconductor layer. The fifth gate electrode may be electrically connected to the first signal line.

The fifth semiconductor layer may include a silicon semiconductor.

DETAILED DESCRIPTION

Figure 1:
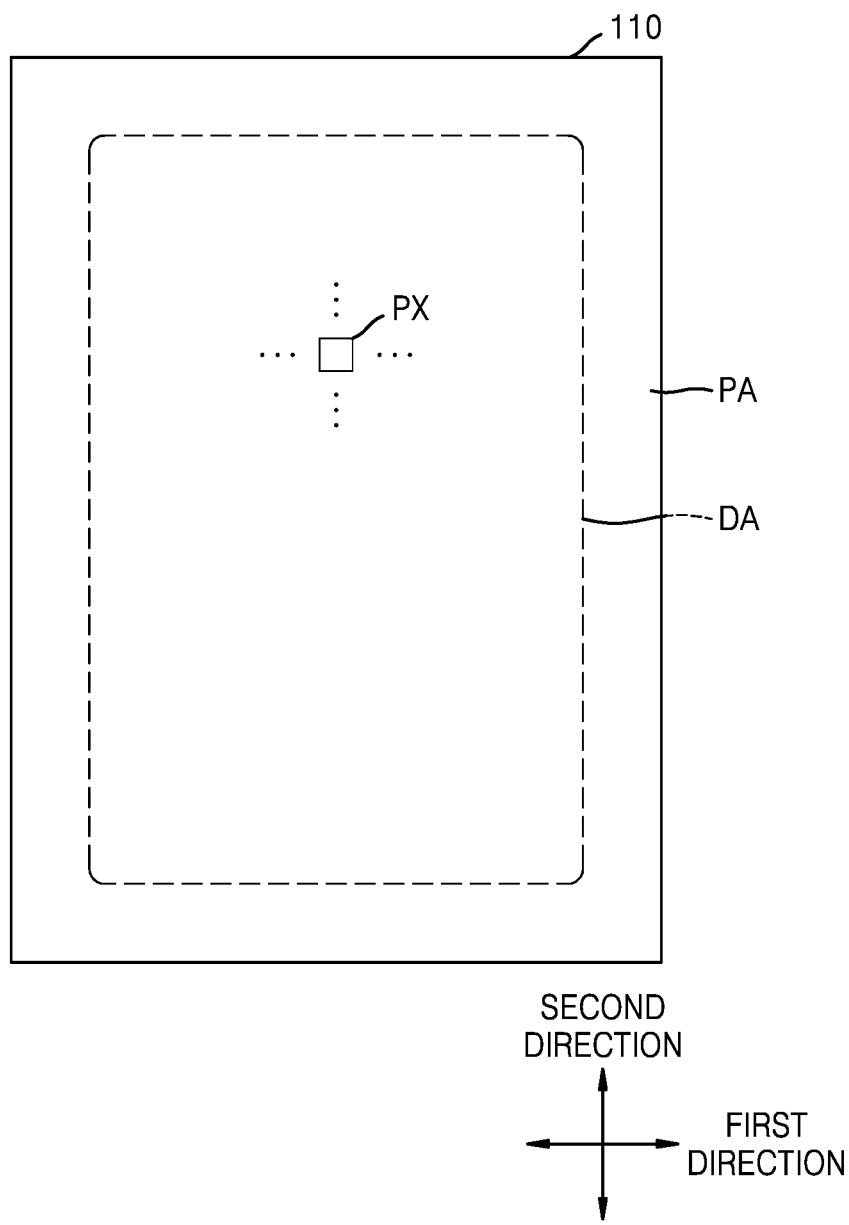
FIG. 1 is a plan view of a display apparatus according to an embodiment.

Example embodiments are described with reference to the drawings. Practical embodiments may be implemented in many different forms and should not be construed as limited to the described embodiments.

In the drawings, like reference numerals may refer to like elements.

Although the terms "first", "second," etc. may be used herein to describe various components/elements, these components should not be limited by these terms. These components may be used to distinguish one component/element from another. A first element may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-type (or first-set)," "second-type (or second-set)," etc., respectively.

An expression used in the singular may encompass the expression of the plural, unless it has a clearly different meaning in the context.

The terms "comprises" and/or "comprising" used herein specify the presence of stated features or components, but do not preclude the presence or addition of one or more other features or components.

When a first component is referred to as being "on" a second component, the first component can be directly or indirectly on the second component. One or more intervening components may be present between the first component and the second component.

Sizes of components in the drawings may be exaggerated for convenience of explanation and may not limit to embodiments.

In this application, "in/on a same/identical layer" may mean "directly contacting a same side/face/surface of a layer," "silicon semiconductor" may mean "silicon semiconductor material" or "silicon," "oxide semiconductor" may mean "oxide semiconductor material," "connect" may mean "electrically connect"; "insulate" may mean "electrically insulate" or "electrically isolate"; "contact" may mean "directly contact." In this application, "upper" and "lower" may be recited for providing examples of relative positions of elements with reference to a substrate when the substrate is positioned as the lowest element of a display apparatus; the relative positions may change according to orientations of the display apparatus.

FIG. 1 is a plan view of a display apparatus according to an embodiment.

Referring to FIG. 1, the display apparatus may include a substrate 110 that may include a display area DA. Pixels PX having display devices such as an organic light-emitting device OLED may be arranged in the display area DA. Various wirings for transmitting electrical signals to pixels PX of the display area DA may be located in a peripheral area PA of the substrate 110. The display apparatus may be/include an organic light-emitting device, a liquid crystal display (LCD) device, an electrophoretic display device, an inorganic EL display device, or the like.

Figure 2:
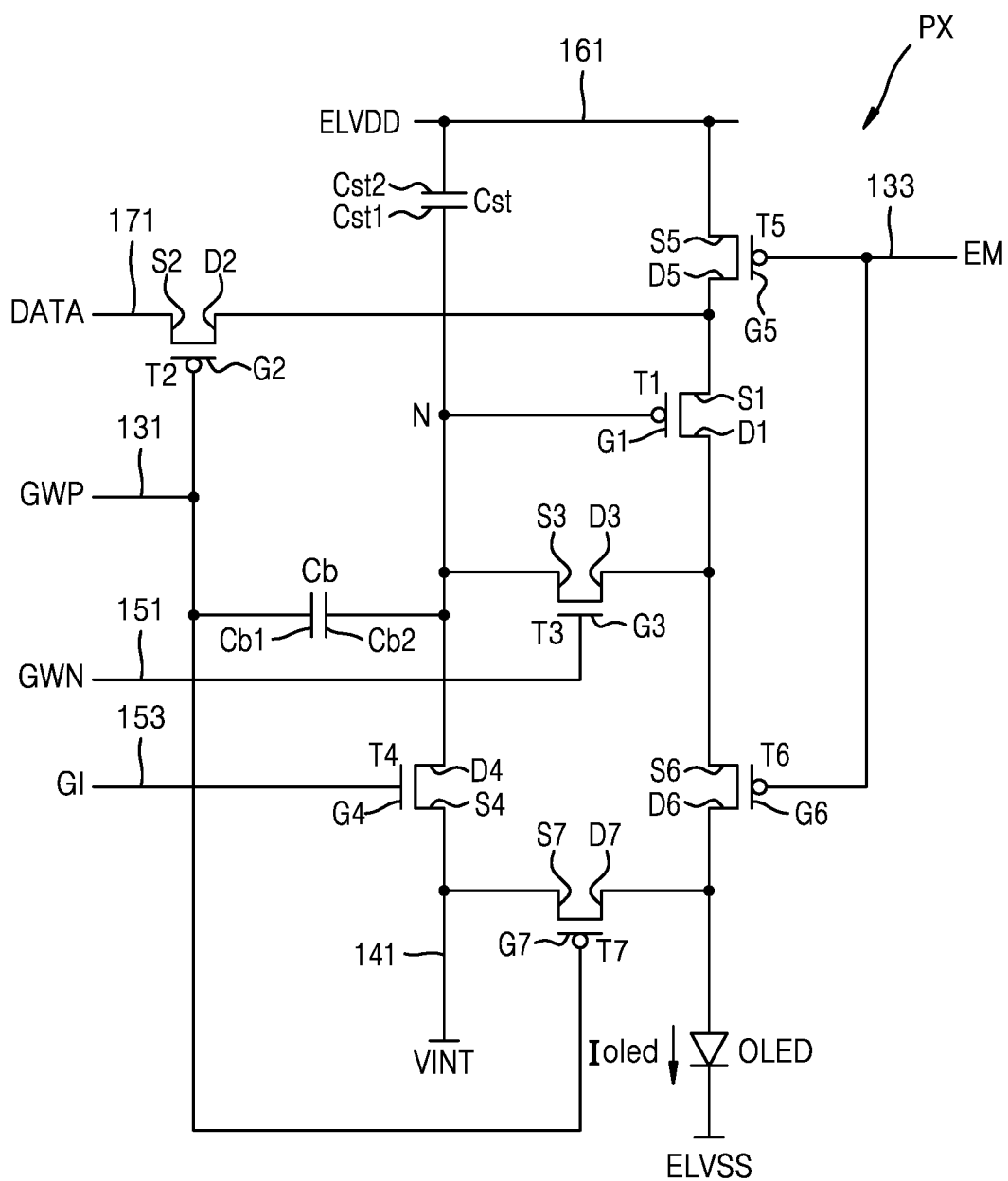
FIG. 2 is an equivalent circuit diagram of a pixel in a display apparatus according to an embodiment.

FIG. 2 is an equivalent circuit diagram of a pixel of a display apparatus according to an embodiment.

Referring to FIG. 2, the pixel PX includes signal lines 131, 133, 151, 153, and 171, first to seventh TFTs T1 to T7 connected to the signal lines 131, 133, 151, 153, and 171, first and second capacitors Cst and Cb, an initialization voltage line 141, a driving voltage line 161, and the organic light-emitting device OLED.

Referring to FIG. 2, the signal lines 131, 133, 151, 153, and 171, the initialization voltage line 141, and the driving voltage line 161 are provided for each pixel PX. In an embodiment, at least one of the signal lines 131, 133, 151, 153, and 171, the initialization voltage line 141 and/or the driving voltage line 161 may be shared by neighboring pixels.

Referring to FIG. 2, each of the third TFT T3 and the fourth TFT T4 of the plurality of first to seventh TFTs T1 to T7 may be an n-channel MOSFET (NMOS) and the others of the plurality of first to seventh TFTs T1 to T7 may each be a p-channel MOSFET (PMOS). In some embodiments, only one of the first to seventh TFTs T1 to T7 may be an NMOS and each of the others of the plurality of first to seventh TFTs T1 to T7 may be a PMOS, or each of the plurality of first to seventh TFTs T1 to T7 may be an NMOS or a PMOS.

The signal lines may include the first scan line 131 for transmitting a first scan signal GWP, the second scan line 151 for transmitting a second scan signal GWN, the third scan line 153 for transmitting a third scan signal GI, the emission control line 133 for transmitting an emission control signal EM, and the data line 171 which crosses the first scan line 131 and transmits a data signal DATA.

The driving voltage line 161 may transmit a first driving voltage ELVDD to the first TFT T1 and the initialization voltage line 141 may transmit an initialization voltage VINT for initializing the first TFT T1 and a pixel electrode.

First electrodes S1 to S7 and second electrodes D1 to D7 of FIG. 2 may each be a source electrode or a drain electrode depending on a type (p-type or n-type) and/or an operating condition of a transistor. In an embodiment, electrodes functioning as a source electrode and a drain electrode are referred to as a first electrode and a second electrode, respectively.

A gate electrode G1 of the first TFT T1 may be connected to a lower electrode Cst1 of a first capacitor Cst and an upper electrode Cb2 of a second capacitor Cb. The first electrode S1 of the first TFT T1 may be connected to the driving voltage line 161 via the fifth TFT T5. The second electrode D1 of the first TFT T1 may be electrically connected to a pixel electrode of the organic light-emitting device OLED via the sixth TFT T6. The first TFT T1 may receive the data signal DATA according to a switching operation of the second TFT T2 and may supply a driving current $I_{oled}$ to the organic light-emitting device OLED.

A gate electrode G2 of the second TFT T2 may be connected to the first scan line 131, a lower electrode Cb1 of a second capacitor Cb, and a gate electrode G7 of the seventh TFT T7. A first electrode S2 of the second TFT T2 is connected to the data line 171. A second electrode D2 of the second TFT T2 is connected to the first electrode S1 of the first TFT T1. The second TFT T2 is turned on according to the first scan signal GWP received through the first scan line 131 and performs a switching operation for transmitting the data signal DATA transmitted to the data line 171 to the first electrode S1 of the first TFT T1.

A gate electrode G3 of the third TFT T3 is connected to the second scan line 151. A second electrode D3 of the third TFT T3 is connected to a second electrode D1 of the first TFT T1 and is further connected to the pixel electrode of the organic light-emitting device OLED through the sixth TFT T6. A first electrode S3 of the third TFT T3 may be connected to the lower electrode Cst1 of the first capacitor Cst, the upper electrode Cb2 of the second capacitor Cb, a second electrode D4 of the fourth TFT T4, and the gate electrode G1 of the first TFT T1. The third TFT T3 is turned on according to the second scan signal GWN received through the second scan line 151 and electrically connects the gate electrode G1 with the second electrode D1 of the first TFT T1 to diode-connect the first TFT T1 thereto.

A gate electrode G4 of the fourth TFT T4 may be connected to the third scan line 153. A first electrode S4 of the fourth TFT T4 is connected to a first electrode S7 of the seventh TFT T7 and the initialization voltage line 141. The second electrode D4 of the fourth TFT T4 may be connected to the lower electrode Cst1 of the first capacitor Cst, the upper electrode Cb2 of the second capacitor Cb, the first electrode S3 of the third TFT T3, and the gate electrode G1 of the first TFT T1. The fourth TFT T4 is turned on according to the third scan signal GI received through the third scan line 153 and initializes a voltage of the gate electrode G1 of the first TFT T1 by transmitting the initialization voltage VINT to the gate electrode G1 of the first TFT T1.

A gate electrode G5 of the fifth TFT T5 may be connected to the emission control line 133. A first electrode S5 of the fifth TFT T5 may be connected to the driving voltage line 161. A second electrode D5 of the fifth TFT T5 may be connected to the first electrode S1 of the first TFT T1 and the second electrode D2 of the second TFT T2.

A gate electrode G6 of the sixth TFT T6 may be connected to the emission control line 133. A first electrode S6 of the sixth TFT T6 may be connected to the second electrode D1 of the first TFT T1 and the second electrode D3 of the third TFT T3. A second electrode D6 of the sixth TFT T6 is electrically connected to a second electrode D7 of the seventh TFT T7 and the pixel electrode of the organic light-emitting device OLED.

The fifth TFT T5 and the sixth TFT T6 are simultaneously turned on in response to the emission control signal EM received through the emission control line 133 so that the first driving voltage ELVDD is transmitted to the organic light-emitting device OLED and the driving current $I_{oled}$ flows through the organic light-emitting device OLED.

A gate electrode G7 of the seventh TFT T7 may be connected to the first scan line 131. The second electrode D7 of the seventh TFT T7 may be connected to the second electrode G6 of the sixth TFT T6 and the pixel electrode of the organic light-emitting device OLED. The first electrode S7 of the seventh TFT T7 may be connected to the first electrode S4 of the fourth TFT T4 and the initialization voltage line 141. The seventh TFT T7 is turned on according to the first scan signal GWP received through the first scan line 131 to initialize the pixel electrode of the organic light-emitting device OLED.

In an embodiment, the gate electrode G7 of the seventh TFT T7 may be connected to the first scan line 131 of the current row. The gate electrode G7 of the seventh TFT T7 may be connected to the first scan line 131 of the previous row or the next row in an embodiment.

The first capacitor Cst includes the lower electrode Cst1 and an upper electrode Cst2. The lower electrode Cst1 may be connected to the gate electrode G1 of the first TFT T1, the first electrode S3 of the third TFT T3, and the second electrode D4 of the fourth TFT T4. The upper electrode Cst2 may be connected to the driving voltage line 161.

The second capacitor Cb includes the lower electrode Cb1 and the upper electrode Cb2. The lower electrode Cb1 may be connected to the first scan line 131, the gate electrode G2 of the second TFT T2, and the gate electrode G7 of the seventh TFT T7. The upper electrode Cb2 may be connected to the gate electrode G1 of the first TFT T1, the first electrode S3 of the third TFT T3, the second electrode D4 of the fourth TFT T4, and the lower electrode Cst1 of the first capacitor Cst. When the first scan signal GWP of the first scan line 131 is a voltage for turning off the second TFT T2, the second capacitor Cb, which is a boosting capacitor, may increase a voltage of a node N to reduce a voltage (black voltage) required for displaying black.

The organic light-emitting device OLED may include a first electrode (pixel electrode) electrically connected to the second electrode D6 of the sixth TFT T6 and a second electrode (opposite electrode) connected to a second power supply for supplying a second power supply voltage ELVSS. The organic light-emitting device OLED may receive a current from the first TFT T1 and may emit light to display an image.

A specific operation of each pixel PX according to an embodiment is as follows.

When the third scan signal GI is supplied through the third scan line 153 during an initialization period, the fourth TFT T4 is turned on in response to the third scan signal GI, and the initialization voltage VINT supplied from the initialization voltage line 141 initializes the first TFT T1.

When the first scan signal GWP and the second scan signal GWN are supplied through the first scan line 131 and the second scan line 151 during a data programming period, the second TFT T2, the seventh TFT T7, and the third TFT T3 are turned on in response to the first scan signal GWP and the second scan signal GWN.

In an embodiment, the first TFT T1 may be diode-connected when the third TFT T3 is turned on, and may be biased in the forward direction. The data signal DATA supplied from the data line 171 for which a threshold voltage Vth of the first TFT T1 is compensated is applied to the first gate electrode G1 of the first TFT T1.

When the first scan signal GWP is supplied through the first scan line 131, the seventh TFT T7 is turned on in response to the first scan signal GWP, and the pixel electrode is initialized by the initialization voltage VINT supplied from the initialization voltage line 141.

The first driving voltage ELVDD and a compensation voltage are applied to both ends of the first capacitor Cst and a charge corresponding to a voltage difference between the both ends is stored in the first capacitor Cst.

During a light emission period, the fifth TFT T5 and the sixth TFT T6 are turned on by the emission control signal EM supplied from the emission control line 133. The driving current $I_{oled}$ corresponding to a voltage difference between a voltage of the gate electrode G1 of the first TFT T1 and the first driving voltage ELVDD is generated and the driving current $I_{oled}$ is supplied to the organic light-emitting device OLED through the sixth TFT T6.

In an embodiment, at least one of the first to seventh TFTs T1 to T7 includes a semiconductor layer including oxide, and the others of the first to seventh TFTs T1 to T7 include a semiconductor layer including silicon.

In more detail, the first TFT T1 directly affecting brightness of a display apparatus is configured to include a semiconductor layer composed of polycrystalline silicon having high reliability, thereby realizing a high-resolution display apparatus.

Meanwhile, since an oxide semiconductor has high carrier mobility and a low leakage current, a voltage drop is not great even if a driving time is long. That is, since a color change of an image due to a voltage drop is not great even in low frequency driving, low frequency driving is possible.

As described above, since an oxide semiconductor has a less leakage current, at least one of the third TFT T3 and the fourth TFT T4 connected to the gate electrode G1 of the first TFT T1 may use an oxide semiconductor to prevent a leakage current from flowing to the first gate electrode G1 and reduce power consumption.

Figure 3:
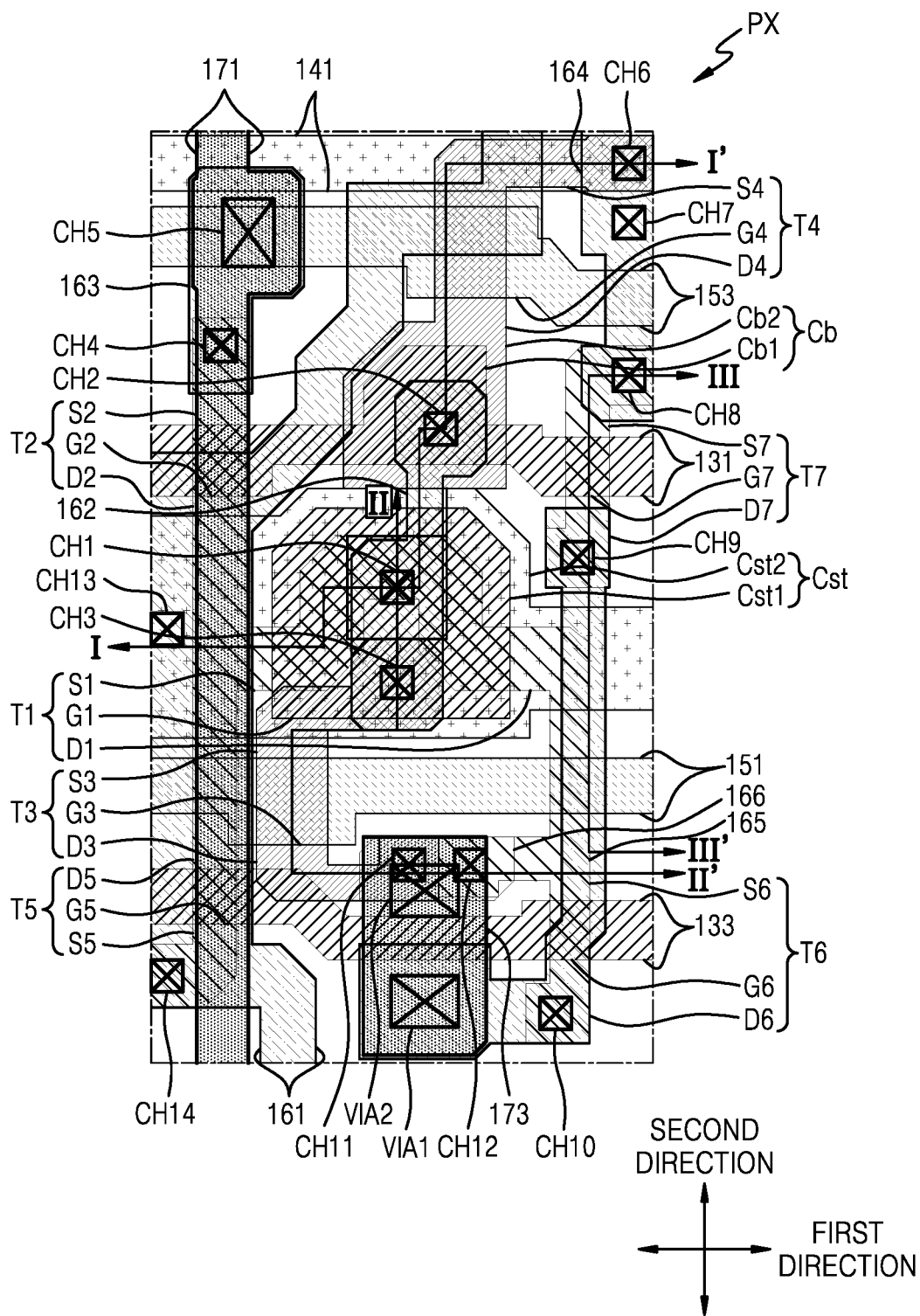
FIG. 3 is a layout diagram illustrating a plurality of thin-film transistors (TFTs) and capacitors arranged in a pixel of a display apparatus according to an embodiment.
Figure 4:
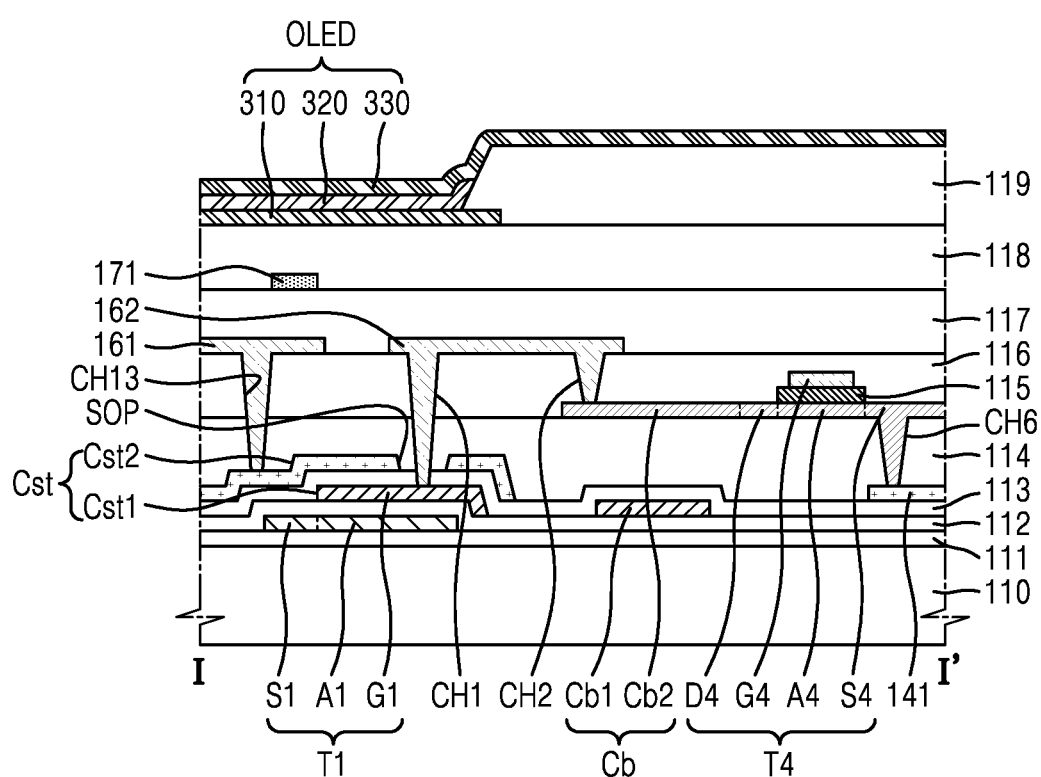
FIG. 4 is a cross-sectional view taken along a line I-I' of FIG. 3 according to an embodiment.
Figure 5:
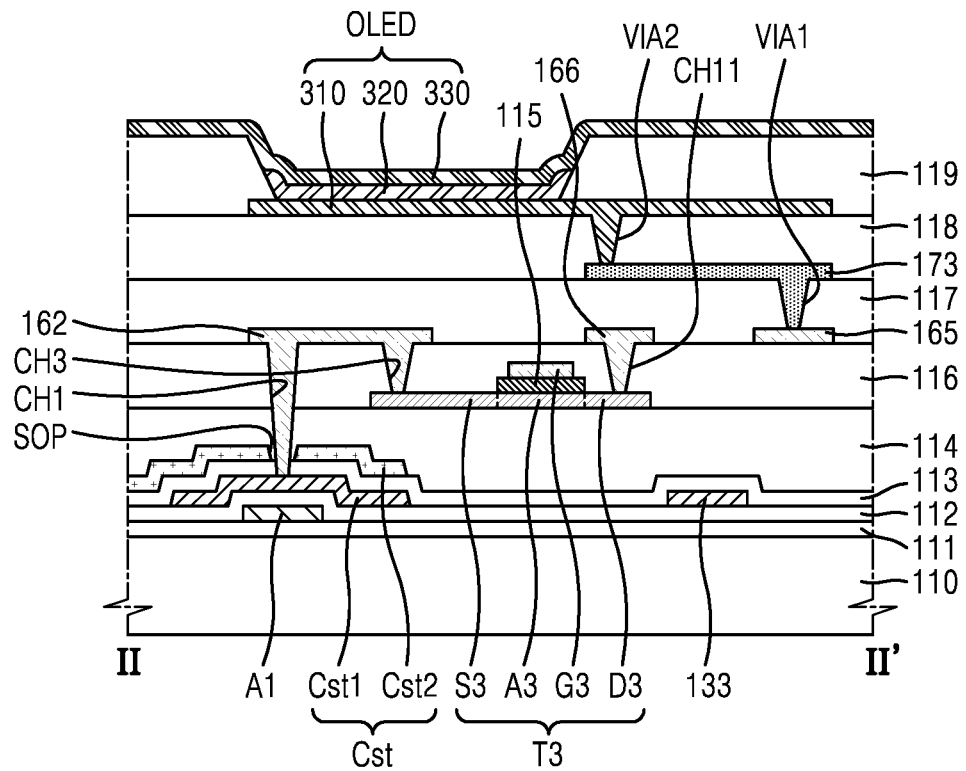
FIG. 5 is a cross-sectional view taken along a line II-II' of FIG. 3 according to an embodiment.
Figure 6:
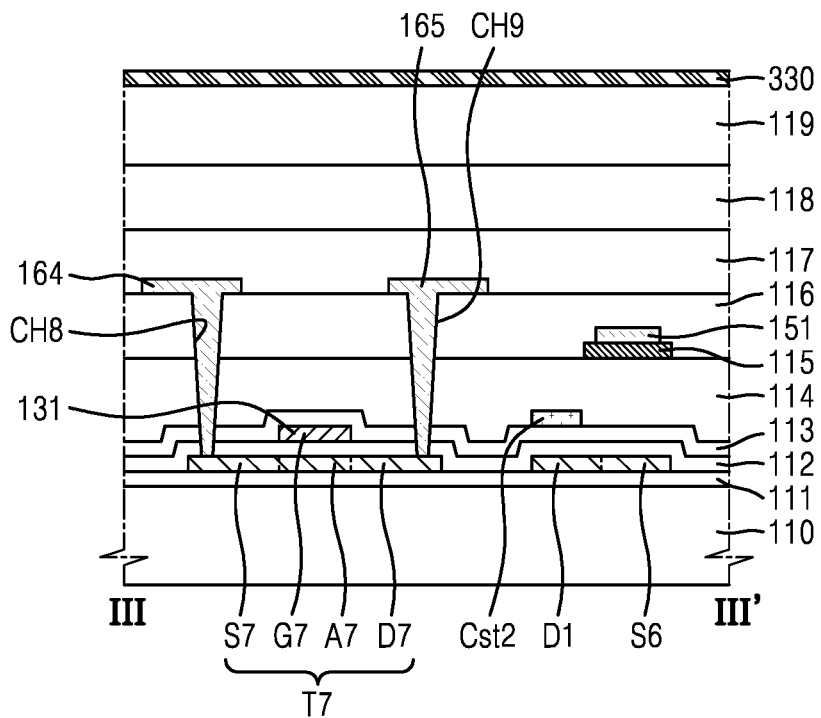
FIG. 6 is a cross-sectional view taken along a line III-III' of FIG. 3 according to an embodiment.

FIG. 3 is a layout diagram of positions of a plurality of thin-film transistors (TFTs) and capacitors arranged in one pixel of a display apparatus according to an embodiment. FIG. 4 is a cross-sectional view taken along a line I-I' of FIG. 3 according to an embodiment, FIG. 5 is a cross-sectional view taken along a line II-II' of FIG. 3 according to an embodiment, FIG. 6 is a cross-sectional view taken along a line III-III' of FIG. 3 according to an embodiment. FIGS. 4 to 6 mainly show structures of the first TFT T1, the third TFT T3, the fourth TFT T4, the seventh TFT T7, the first capacitor Cst, and the second capacitor Cb.

The pixel PX of the display apparatus according to an embodiment may include a plurality of wirings extending in a first direction and a plurality of wirings extending in a second direction intersecting the first direction. The first scan line 131, the second scan line 151, the third scan line 153, the emission control line 133, and the initialization voltage line 141 extend in the first direction. The data line 171 and the driving voltage line 161 extend in the second direction.

Furthermore, the pixel PX may include first to seventh TFTs T1 to T7 and the first and second capacitors Cst and Cb. Each of the first to seventh TFTs T1 to T7 may include a semiconductor layer including a source region, a drain region, and a channel region between the source region and the drain region, and a gate electrode insulated from the semiconductor layer at a position corresponding to the channel region.

In an embodiment, each of the first TFT T1, the second TFT T2, the fifth TFT T5, the sixth TFT T6, and the seventh TFT T7 may include a semiconductor layer including a silicon semiconductor. Each of the third TFT T3 and the fourth TFT T4 may include a semiconductor layer including an oxide semiconductor.

A first electrode and a second electrode of a TFT shown in FIG. 2 correspond to a source region and a drain region shown in FIGS. 3 to 6, respectively. A source region and a drain region correspond to a source electrode and a drain electrode, respectively. The first and second electrodes of the TFT may be recited interchangeably with the source region and the drain region, respectively.

In the description of FIGS. 3 to 6, semiconductor layers of the first to seventh TFTs T1 to T7 are referred to as A1 to A7.

A buffer layer 111 is arranged on the substrate 110 and semiconductor layers of the first TFT T1, the second TFT T2, the fifth TFT T5, the sixth TFT T6, and the seventh TFT T7 are arranged on the buffer layer 111.

The substrate 110 may include a glass material, a ceramic material, a metal material, a plastic material, or a material having a flexible or a bendable property. The substrate 110 may have a monolayer or a multilayer structure, and the multilayer structure may further include an inorganic layer. In some embodiments, the substrate 110 may have an organic/inorganic/organic structure.

The buffer layer 111 may be formed of an oxide film such as silicon oxide ($SiO_x$) and/or a nitride film such as silicon nitride ($SiN_x$). The buffer layer 111 may be unnecessary.

The semiconductor layers of the first TFT T1, the second TFT T2, the fifth TFT T5, the sixth TFT T6, and the seventh TFT T7 are arranged in an identical layer and include an identical material. For example, the semiconductor layers may include polycrystalline silicon.

The semiconductor layers of the first TFT T1, the second TFT T2, the fifth TFT T5, and the sixth TFT T6 are connected to each other and may be bent into various shapes. The semiconductor layer of the seventh TFT T7 may be connected to the semiconductor layer of the sixth TFT T6 using a connection electrode 166.

Each of the semiconductor layers of the first TFT T1, the second TFT T2, the fifth TFT T5, the sixth TFT T6, and the seventh TFT T7 may include a channel region, a source region and a drain region on both sides of the channel region. First doping to the channel region and second doping to the source region and the drain region using a gate electrode as a mask may be performed on the semiconductor layer. In an embodiment, the first doping may be unnecessary.

A first insulating layer 112 may be arranged on the semiconductor layers of the first TFT T1, the second TFT T2, the fifth TFT T5, the sixth TFT T6, and the seventh TFT T7, and the gate electrodes G1, G2 and G5 to G7 of the seventh TFT T7 may be arranged on the first insulating layer 112. The first scan line 131 and the emission control line 133 may include the same material as the gate electrodes G1, G2, and G5 to G7, may be on the same layer as the gate electrodes G1, G2 and G5 to G7, and may extend in the first direction.

The first insulating layer 112 may include an inorganic material including oxide or nitride. For example, the first insulating layer 112 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO).

Each of the gate electrodes G1, G2 and G5 to G7 includes molybdenum (Mo), aluminum (Al), copper (Cu), or titanium (Ti) and may be formed as a monolayer or a multilayer.

The semiconductor layer A1 of the first TFT T1 includes the source region S1, the drain region D1, and a channel region between the regions S1 and D1 The gate electrode G1 of the first TFT T1 overlaps the channel region. The semiconductor layer A1 of the first TFT T1 has a curve so that the channel region may be formed long and a driving range of a gate voltage applied to the gate electrode G1 may be widened. The shape of the semiconductor layer A1 of the first TFT T1 may be 'ㄷ', 'ㄹ', 'S', 'M', 'W', and the like. The gate electrode G1 of the first TFT T1 is an island type and is provided so as to overlap the semiconductor layer A1. The first insulating layer 112 is between the semiconductor layer A1 and the gate electrode G1 of the first TFT T1.

The gate electrode G1 of the first TFT T1 is electrically connected to the upper electrode Cb2 of the second capacitor Cb by a connection electrode 162. The connection electrode 162 is provided on a fifth insulating layer 116 and may be in contact with the gate electrode G1 of the first TFT T1 and the upper electrode Cb2 of the second capacitor Cb through contact holes CH1 and CH2, respectively. The contact hole CH1 may be formed in a third insulating layer 114 and the fifth insulating layer 116 to expose a portion of the gate electrode G1 of the first TFT T1. The contact hole CH2 may be formed in the fifth insulating layer 116 to expose a portion of the upper electrode Cb2 of the second capacitor Cb.

A semiconductor layer A2 of the second TFT T2 includes a source region S2, a drain region D2, and a channel region between the regions S2 and D2. The gate electrode G2 of the second TFT T2 overlaps the channel region and is formed by a portion of the first scan line 131. The source region S2 of the second TFT T2 is electrically connected to the data line 171 by a connection electrode 163. The connection electrode 163 is provided on the fifth insulating layer 116 and may be in contact with the source region S2 and the data line 171 of the second TFT T2 through contact holes CH4 and CH5, respectively. The contact hole CH4 may be formed in the first to third insulating layers 112 to 114 and fifth insulating layer 116 to expose a portion of the source region S2 of the second TFT T2. The contact hole CH5 may be formed in a sixth insulating layer 117 on the connection electrode 163 to expose a portion of an upper surface of the connection electrode 163. The data line 171 is arranged on the sixth insulating layer 117 and may be in contact with the connection electrode 163 through the contact hole CH5. The drain region D2 of the second TFT T2 may be connected to the source region S1 of the first TFT T1.

A semiconductor layer A5 of the fifth TFT T5 includes a source region S5, a drain region D5, and a channel region between the regions S5 and D5. The gate electrode G5 of the fifth TFT T5 overlaps the channel region and is formed by a portion of the emission control line 133. The source region S5 of the fifth TFT T5 is electrically connected to the driving voltage line 161 through a contact hole CH14. The contact hole CH14 may be formed in the first to third insulating layers 112 to 114 and fifth insulating layer 116 to expose a portion of the source region S5 of the fifth TFT T5. The driving voltage line 161 is arranged on the fifth insulating layer 116 and may be in contact with the source region S5 of the fifth TFT T5 through the contact hole CH14. The drain region D5 of the fifth TFT T5 may be connected to the source region S1 of the first TFT T1.

A semiconductor layer A6 of the sixth TFT T6 includes a source region S6, a drain region D6, and a channel region between the regions S6 and D6. The gate electrode G6 of the sixth TFT T6 overlaps the channel region and is formed by a portion of the emission control line 133. The source region S6 of the sixth TFT T6 may be connected to the source region S1 of the first TFT T1. The source region S6 of the sixth TFT T6 is electrically connected to a drain region D3 of the third TFT T3 by the connection electrode 166. The connection electrode 166 is provided on a fifth insulating layer 116 and may be in contact with the drain region D3 of the third TFT T3 and the source region S6 of the sixth TFT T6 through contact holes CH11 and CH12. The contact hole CH11 may be formed in the fifth insulating layer 116 to expose a portion of the drain region D3 of the third TFT T3. The contact hole CH12 may be formed in the first to third insulating layers 112 to 114 and fifth insulating layer 116 to expose a portion of the source region S6 of the sixth TFT T6. The drain region D6 of the sixth TFT T6 is electrically connected to a drain region D7 of the seventh TFT T7 by a connection electrode 165. The connection electrode 165 is provided on the fifth insulating layer 116 and may be in contact with the drain region D7 of the seventh TFT T7 and the drain region D6 of the sixth TFT T6 through contact holes CH9 and CH10, respectively. The contact hole CH9 may be formed in the first to third insulating layers 112 to 114 and fifth insulating layer 116 to expose a portion of the drain region D7 of the seventh TFT T7. The contact hole CH10 may be formed in the first to third insulating layers 112 to 114 and fifth insulating layer 116 to expose a portion of the drain region D6 of the sixth TFT T6.

The semiconductor layer A7 of the seventh TFT T7 includes a source region S7, a drain region D7, and a channel region between the regions S7 and D7. The gate electrode G7 of the seventh TFT T7 overlaps the channel region and is formed by a portion of the first scan line 131. The source region S7 of the seventh TFT T7 is electrically connected to a source region S4 of the fourth TFT T4 by a connection electrode 164. The connection electrode 164 is provided on a fifth insulating layer 116 and may be in contact with the source region S4 of the fourth TFT T4 and the source region S7 of the seventh TFT T7 through contact holes CH7 and CH8, respectively. The contact hole CH7 may be formed in the fifth insulating layer 116 to expose a portion of the source region S4 of the fourth TFT T4. The contact hole CH8 may be formed in the first to third insulating layers 112 to 114 and fifth insulating layer 116 to expose a portion of the source region S7 of the seventh TFT T7. The drain region D7 of the seventh TFT T7 is electrically connected to the drain region D6 of the sixth TFT T6 by the connection electrode 165. The connection electrode 165 is provided on the fifth insulating layer 116 and may be in contact with the drain region D7 of the seventh TFT T7 and the drain region D6 of the sixth TFT T6 through contact holes CH9 and CH10, respectively. The contact hole CH9 may be formed in the first to third insulating layers 112 to 114 and fifth insulating layer 116 to expose a portion of the drain region D7 of the seventh TFT T7. The contact hole CH10 may be formed in the first to third insulating layers 112 to 114 and fifth insulating layer 116 to expose a portion of the drain region D6 of the sixth TFT T6.

A second insulating layer 113 is arranged on the gate electrodes G1, G2 and G5 to G7 of the first TFT T1, the second TFT T2, the fifth TFT T5, the sixth TFT T6, and the seventh TFT T7. The upper electrode Cst2 of the first capacitor Cst is arranged on the second insulating layer 113. The initialization voltage line 141 including the same material as that of the upper electrode Cst2 of the first capacitor Cst and being on the same layer as the upper electrode Cst2 of the first capacitor Cst extends in the first direction.

The second insulating layer 113 may include an inorganic material including the oxide or the nitride described above. The upper electrode Cst2 of the first capacitor Cst includes molybdenum (Mo), copper (Cu), or titanium (Ti) and may be formed as a monolayer or a multilayer.

The first capacitor Cst is arranged to overlap the first TFT T1. The first capacitor Cst includes the lower electrode Cst1 and the upper electrode Cst2. The lower electrode Cst1 of the first capacitor Cst is the gate electrode G1 of the first TFT T1. That is, it can be understood that the lower electrode Cst1 of the first capacitor Cst and the gate electrode G1 of the first TFT T1 are integral. The lower electrode Cst1 of the first capacitor Cst is formed in a square shape separated from adjacent pixels, which including the same material as those of the first scan line 131 and the emission control line 133 and being on the same layer as the first scan line 131 and the emission control line 133. The upper electrode Cst2 of the first capacitor Cst covers the entire lower electrode Cst1 with the second insulating layer 113 between the electrodes Cst1 and Cst2 and overlaps the lower electrode Cst1. The second insulating layer 113 may serve as a dielectric layer of the first capacitor Cst. The upper electrode Cst2 of the first capacitor Cst may include an opening SOP. The opening SOP is formed by removing a portion of the upper electrode Cst2 at a position corresponding to the contact hole CH1 exposing a portion of the lower electrode Cst1 and may have a closed curve shape. The connection electrode 162 may be connected to the lower electrode Cst1 through the contact hole CH1 arranged in the opening SOP. The upper electrode Cst2 may be connected to the driving voltage line 161 through a contact hole CH13. The contact hole CH13 may be formed in the third insulating layer 114 and the fifth insulating layer 116.

The TFTs T3 and T4 including an oxide semiconductor may be arranged on the TFTs T1, T2, T5, T6, and T7 including a silicon semiconductor and the first capacitor Cst.

The third insulating layer 114 is arranged on the upper electrode Cst2 of the first capacitor Cst. A semiconductor layer A3 of the third TFT T3 and a semiconductor layer A4 of the fourth TFT T4 are arranged on the third insulating layer 114. The semiconductor layer A3 of the third TFT T3 and the semiconductor layer A4 of the fourth TFT T4 are arranged in an identical layer and include an identical material. For example, the semiconductor layer may include an oxide semiconductor.

The third insulating layer 114 may include the inorganic material including the oxide or the nitride described above. The oxide semiconductor is a zinc (Zn) oxide-based material and may be formed of Zn oxide, indium (In)—Zn oxide, gallium (Ga)—In—Zn oxide, or the like. In some embodiments, the oxide semiconductor may be an In—Ga—Zn—O (IGZO) semiconductor in which ZnO contains metals such as In and Ga.

The semiconductor layer A3 of the third TFT T3 and the semiconductor layer A4 of the fourth TFT T4 may include a channel region, and a source region and a drain region on both sides of the channel region. In an example, the source region and the drain region may be regions where carrier concentration is increased by plasma treatment. The source region and the drain region may be formed to be conductive by adjusting the carrier concentration of the oxide semiconductor. For example, the source region and the drain region may be formed by increasing the carrier concentration through the plasma treatment using a hydrogen (H)-based gas, a fluorine (F)-based gas, or a combination thereof to the oxide semiconductor.

The gate electrodes G3 and G4 of the third TFT T3 and the fourth TFT T4 are arranged on the semiconductor layer A3 of the third TFT T3 and the semiconductor layer A4 of the fourth TFT T4. A fourth insulating layer 115 is formed between the semiconductor layer A3 and the gate electrode G3 of the third TFT T3 and between the semiconductor layer A4 and the gate electrode G4 of the fourth TFT T4.

The gate electrodes G3 and G4 include Mo, Cu, Ti, and the like and may be formed as a monolayer or a multilayer.

Although a width of the fourth insulating layer 115 is shown to be wider than a width of the gate electrodes G3 and G4 in drawings, the width of the fourth insulating layer 115 and the width of the gate electrodes G3 and G4 may be substantially the same in one direction. For example, the fourth insulating layer 115 may be formed through the same mask stamping process as that of the gate electrodes G3 and G4, so that a side surface of the fourth insulating layer 115 and side surfaces of the gate electrodes G3 and G4 coincide with each other and may be arranged on an identical plane. The fourth insulating layer 115 may include an inorganic material including the oxide or the nitride described above.

The second scan line 151 and the third scan line 153 including the same material as those of the gate electrodes G3 and G4 of the third TFT T3 and the fourth TFT T4 and being on the same layer as the gate electrodes G3 and G4 of the third TFT T3 and the fourth TFT T4 extend in the first direction.

Although the fourth insulating layer 115 is provided only in regions corresponding to the gate electrodes G3 and G4 and the second scan line 151 and the third scan line 153 in drawings, the fourth insulating layer 115 may be formed on the entire surface of the substrate 110 without patterning.

The third TFT T3 includes the semiconductor layer A3 including an oxide semiconductor and the gate electrode G3. The semiconductor layer A3 includes the source region S3, the drain region D3, and a channel region between the regions S3 and D3. The gate electrode G3 of the third TFT T3 overlaps the channel region and is formed by a portion of the second scan line 151. The source region S3 of the third TFT T3 may be bridged to the gate electrode G1 of the first TFT T1 by the connection electrode 162. One end of the connection electrode 162 may be connected to the source region S3 of the third TFT T3 through a contact hole CH3, a middle portion of the connection electrode 162 may be connected to the gate electrode G1 of the first TFT T1 through the contact hole CH1, and the other end of the connection electrode 162 may be in contact with the upper electrode Cb1 of the second capacitor Cb through the contact hole CH2. The contact hole CH3 may be formed in the fifth insulating layer 116 to expose a portion of the source region S3 of the third TFT T3. The drain region D3 of the third TFT T3 is electrically connected to the source region S6 of the sixth TFT T6 by the connection electrode 166. One end of the connection electrode 166 may be in contact with the drain region D3 of the third TFT T3 through the contact hole CH11, and the other end of the connection electrode 166 may be in contact with the source region S6 of the sixth TFT T6 through the contact hole CH12. The contact hole CH11 may be formed in the fifth insulating layer 116 to expose a portion of the drain region D3 of the third TFT T3. The contact hole CH12 may be formed in the first to third insulating layers 112 to 114 and fifth insulating layer 116 to expose a portion of the source region S6 of the sixth TFT T6.

The fourth TFT T4 includes the semiconductor layer A4 including an oxide semiconductor and the gate electrode G4. The semiconductor layer A4 includes the source region S4, a drain region D4, and a channel region between the regions S4 and D4. The gate electrode G4 of the fourth TFT T4 overlaps the channel region and is formed by a portion of the third scan line 153. The source region S4 of the fourth TFT T4 may be in contact with the initialization voltage line 141 through a contact hole CH6. The contact hole CH6 may be formed in the third insulating layer 114 to expose a portion of the initialization voltage line 141 on the second insulating layer 113. The drain region D4 of the fourth TFT T4 may be connected to the upper electrode Cb2 of the second capacitor Cb.

The second capacitor Cb includes the lower electrode Cb1 and the upper electrode Cb2. The second capacitor Cb may be a portion that protrudes from the first scan line 131 and has a predetermined area. The upper electrode Cb2 of the second capacitor Cb overlaps the lower electrode Cb1 so as to cover the entire lower electrode Cb1. Here, the second insulating layer 113 and the third insulating layer 114 may serve as a dielectric layer of the second capacitor Cb. The upper electrode Cb2 of the second capacitor Cb extends from the drain region D4 of the fourth TFT T4, and thus may include an oxide semiconductor. The upper electrode Cb2 of the second capacitor Cb is electrically connected to the gate electrode G1 of the first TFT T1 by the connection electrode 162.

The fifth insulating layer 116 may be arranged on the TFTs T3 and T4 including the oxide semiconductor, and the driving voltage line 161 and the connection electrodes 162 to 166 may be arranged on the fifth insulating layer 116. The fifth insulating layer 116 may include an inorganic material including the oxide or the nitride described above.

The driving voltage line 161 and the connection electrodes 162 to 166 may include a highly conductive material such as a metal or a conductive oxide. For example, the driving voltage line 161 and the connection electrodes 162 to 166 may be a monolayer or a multilayer including Al, Cu, Ti, or the like. In some embodiments, the driving voltage line 161 and the connection electrodes 162 to 166 may include a triple layer (Ti/Al/Ti) in which Ti, Al, and Ti are sequentially stacked.

The sixth insulating layer 117 may be arranged on the driving voltage line 161 and the connection electrodes 162 to 166, and the data line 171 and a connection electrode 173 may be arranged on the sixth insulating layer 117. The data line 171 may extend in the second direction. The data line 171 may be arranged on a left side or a right side of the pixel PX. The data line 171 may be arranged on a left side or a right side of the first TFT T1. A via hole VIA1 may be formed in the sixth insulating layer 117 to expose a portion of the connection electrode 165. The connection electrode 173 may be in contact with the connection electrode 165 through the via hole VIA1.

The sixth insulating layer 117 may include an organic material such as acryl, benzocyclobutene (BCB), polyimide, or hexamethyldisiloxane (HMDSO). In an embodiment, a seventh insulating layer 118 may include the above-described inorganic material.

The data line 171 and the connection electrode 173 may include a highly conductive material such as a metal or a conductive oxide. For example, the data line 171 and the connection electrode 173 may be a monolayer or a multilayer including Al, Cu, Ti, or the like.

The seventh insulating layer 118 may be arranged on the data line 171 and the connection electrode 173. A via hole VIA2 may be formed in the seventh insulating layer 118 to expose a portion of the connection electrode 173.

The seventh insulating layer 118 may include an organic material such as acryl, BCB, polyimide, or HMDSO. In an embodiment, the seventh insulating layer 118 may include the above-described inorganic material. The seventh insulating layer 118 serves as a protective film covering the TFTs T1 to T7 and an upper surface of the seventh insulating layer 118 is formed to be flat. The seventh insulating layer 118 may be a monolayer or a multilayer.

The organic light-emitting device OLED may be on the seventh insulating layer 118. The organic light-emitting device OLED may include a first electrode (pixel electrode) 310, a second electrode (opposite electrode) 330, and an intermediate layer 320 between the first electrode 310 and the second electrode 330. An eighth insulating layer 119 is on the seventh insulating layer 118 to cover an edge of the first electrode 310. The eighth insulating layer 119 may define a pixel by having an opening exposing a portion of the first electrode 310.

The first electrode 310 of the organic light-emitting device OLED may be in contact with the connection electrode 173 through a via hole VIA2. The first electrode 310 may be a reflective layer including a reflective conductive material such as silver (Ag), magnesium (Mg), aluminum (Al), platinum (Pt), palladium (Pd), gold (Au), nickel (Ni), neodymium (Nd), iridium (Ir), chromium (Cr), and a compound thereof. In an embodiment, the first electrode 310 may be a transparent conductive layer including at least one transparent conductive oxide of indium tin oxide (ITO), indium zinc oxide (IZO), zinc oxide (ZnO), indium oxide ($In_2O_3$), indium gallium oxide (IGO), or aluminum zinc oxide (AZO). In an embodiment, the first electrode 310 may have a stack structure of the reflective layer and the transparent conductive layer.

The eighth insulating layer 119 may include an organic material such as acryl, BCB, polyimide, or HMDSO.

The intermediate layer 320 of the organic light-emitting device OLED may include at least a light-emitting layer (EML), and may further include at least one functional layer from among a hole injection layer (HIL), a hole transport layer (HTL), an electron transport layer (ETL), and an electron injection layer (EIL). The EML may be a red light-emitting layer, a green light-emitting layer, or a blue light-emitting layer. In an embodiment, the EML may have a multilayer structure in which a red light-emitting layer, a green light-emitting layer, and a blue light-emitting layer are stacked or may have a monolayer structure including a red light emitting material, a green light emitting material, and a blue light emitting material so as to emit white light. The intermediate layer 320 of the organic light-emitting device OLED is illustrated as being patterned to correspond only to the first electrode 310. However, this is only for the sake of convenience. The intermediate layer 320 may be formed integrally with the intermediate layer 320 of an adjacent pixel. In addition, some layers of the intermediate layer 320 may be formed on a pixel-by-pixel basis, and the other layers of the intermediate layer 320 may be formed integrally with the intermediate layer 320 of the adjacent pixel.

The second electrode 330 of the organic light-emitting device OLED may include various conductive materials. For example, the second electrode 330 may include at least one of lithium (Li), calcium (Ca), lithium fluoride (LiF), Al, Mg, and Ag or a light-transmitting metal oxide such as ITO, IZO, or ZnO, and may be formed as a monolayer or a multilayer structure.

A thin-film encapsulation layer (not shown) may be on the organic light-emitting device OLED. The thin-film encapsulation layer may cover the display area DA and extend to the outside of the display area DA. The thin-film encapsulation layer may include an inorganic encapsulation layer provided with at least one inorganic material and an organic encapsulation layer provided with at least one organic material. In some embodiments, the thin-film encapsulation layer may be provided with a structure in which a first inorganic encapsulation layer/an organic encapsulation layer/a second inorganic encapsulation layer are stacked.

A spacer for preventing mask stamping may further be formed on the eighth insulating layer 119. Various functional layers such as a polarizing layer, a black matrix, a color filter, and/or a touch screen having a touch electrode may be provided on the thin-film encapsulation layer.

Figure 7:
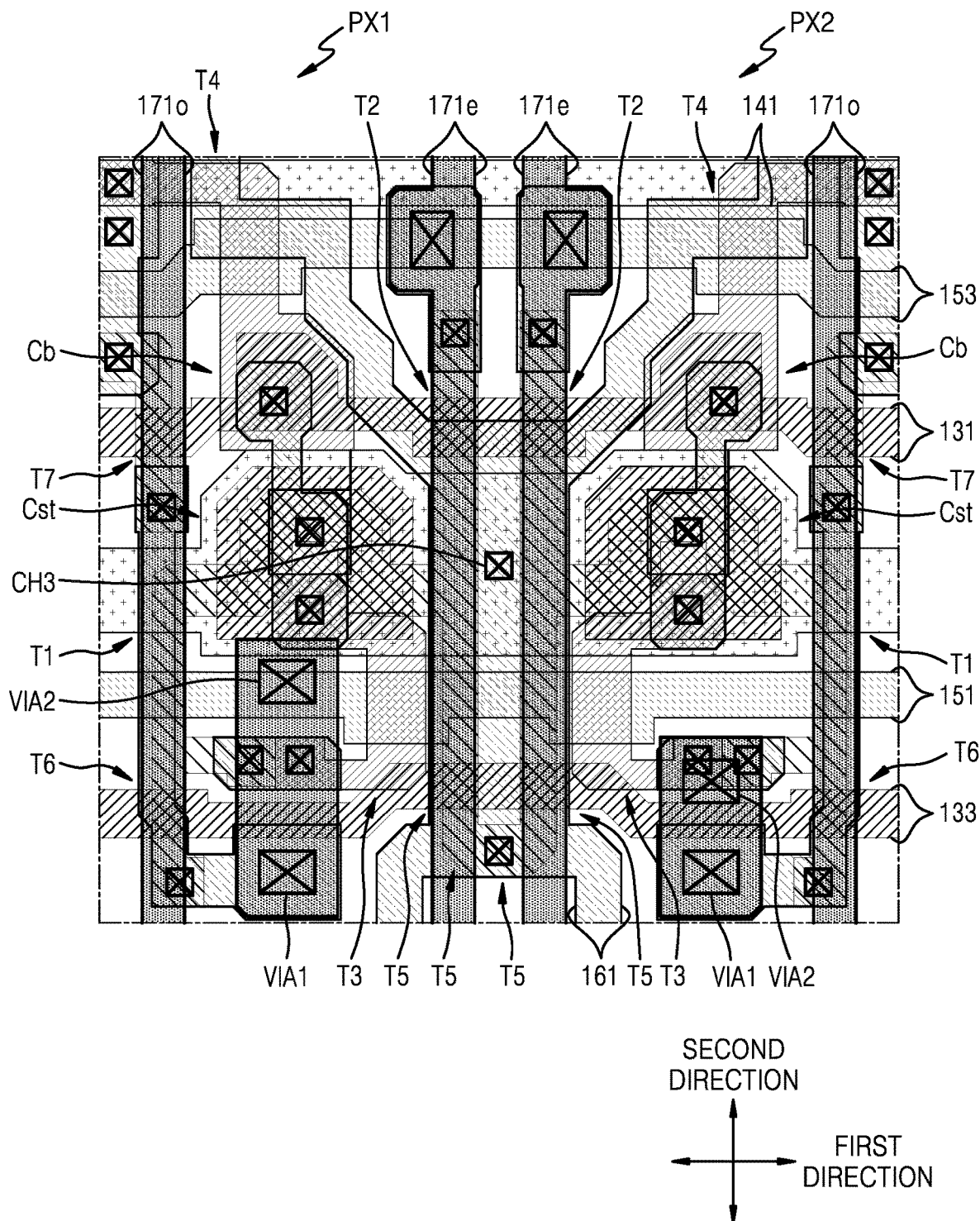
FIG. 7 is a layout diagram illustrating a plurality of TFTs and capacitors arranged in a pair of pixels according to an embodiment.

FIG. 7 is a layout diagram of positions of a plurality of TFTs and capacitors arranged in a pair of pixels according to an embodiment.

A plurality of pixels PX may be arranged along rows and columns in the display area DA. FIG. 7 shows a pair of a first pixel PX1 and a second pixel PX2 arranged on even rows and adjacent to each other. The first pixel PX1 may be arranged in a first column and the second pixel PX2 may be arranged in a second column adjacent to the first column. The arrangement of the TFTs T1 to T7 and the first and second capacitors Cst and Cb of the first pixel PX1 may be symmetrical with the arrangement of the TFTs T1 to T7 and the first and second capacitors Cst and Cb of the second pixel PX2.

The first pixel PX1 and the second pixel PX2 may share the initialization voltage line 141, the third scan line 153, the first scan line 131, the second scan line 151, and the emission control line 133. The initialization voltage line 141, the third scan line 153, the first scan line 131, the second scan line 151, and the emission control line 133 may extend in the first direction at regular intervals from upper sides to lower sides of the first pixel PX1 and the second pixel PX2 in a plan view of the display apparatus. The second capacitor Cb may be between the third scan line 153 and the first scan line 131. The first TFT T1 and the first capacitor Cst may be between the first scan line 131 and the second scan line 151.

If the second scan line 151 is arranged adjacent to the first scan line 131 on the first TFT T1, the second scan line 151 overlaps the connection electrode 162. Accordingly, when an OFF potential (a potential for turning off T3) is applied to the second scan line 151, a voltage of the gate electrode G1 of the first TFT T1 fluctuates and a black voltage increases.

In an embodiment, the second scan line 151 connected to an N-type TFT is arranged at a position that does not overlap the first TFT T1, for example, under the first TFT T1 in a plan view, and thus, reduction in a voltage of a gate electrode of the first TFT T1 may be minimized.

In an embodiment, the voltage of the gate electrode G1 of the first TFT T1 may be increased to reduce the black voltage because of a boost capacitor including a protrusion (Cb1) of the first scan line 131; the first scan line 131 is connected to a P-type TFT.

The data line 171 may extend in the second direction. Two data lines 171o and 171e may be arranged in parallel in one pixel column. The two data lines 171o and 171e of each column include the first data line 171o connected to a pixel in an odd pixel row and the second data line 171e connected to a pixel in an even pixel row. The first data line 171o and the second data line 171e adjacent to each other are alternately connected to pixels PX located in an identical pixel column. The first data line 171o is arranged on the left side of the first pixel PX1 and the second data line 171e is arranged on the right side. The second data line 171e is arranged on the left side of the second pixel PX2, and the first data line 171o is arranged on the right side. That is, second data lines 171e are arranged adjacent to each other between the first pixel PX1 and the second pixel PX2.

The first pixel PX1 and the second pixel PX2 may share the driving voltage line 161. The driving voltage line 161 may be between the first pixel PX1 and the second pixel PX2. The second electrode Cst2 of the first capacitor Cst of the first pixel PX1 and the second electrode Cst2 of the first capacitor Cst of the second pixel PX2 are connected to each other and may be electrically connected to the driving voltage line 161 through the contact hole CH3 between the first pixel PX1 and the second pixel PX2. Accordingly, the driving voltage line 161 functions as a power supply line extending in the second direction and the second electrode Cst2 of the first capacitor Cst functions as a power supply line extending in the first direction. The driving voltage line 161 may have a mesh structure as a whole.

Embodiments employ a driving TFT (e.g., TFT T1) having a silicon semiconductor of high reliability as a semiconductor layer and employ at least one TFT having an oxide semiconductor having a low leakage current as a semiconductor layer, and thus may provide a display apparatus having high reliability and low power consumption.

In embodiments, a display apparatus may require a minimum amount of voltage for displaying black, i.e., minimize black voltage. The display apparatus may include a boost capacitor for compensating for voltage variation of a gate electrode of a driving TFT and/or may include a scan line not overlapping the driving TFT, such that voltage may be stabilized and/or conserved.

According to an embodiment, a driving circuit for driving a display device includes both a TFT including a silicon semiconductor and a TFT including an oxide semiconductor. Advantageously, a high-resolution display apparatus may operate with low power consumption.

Embodiments described herein should be considered in a descriptive sense only and not for purposes of limitation. Descriptions of features or aspects within each embodiment should typically be considered as available for similar features or aspects in other embodiments.

While embodiments have been described with reference to the figures; various changes in form and details may be made in the described embodiments without departing from the spirit and scope defined by the following claims.

What is claimed is:

1. A display apparatus comprising:
a first transistor comprising a first semiconductor layer and a first gate electrode insulated from the first semiconductor layer, the first semiconductor layer comprising a first silicon semiconductor;
a second transistor comprising a second semiconductor layer and a second gate electrode insulated from the second semiconductor layer, the second semiconductor layer comprising a first oxide semiconductor; and
a capacitor comprising a first electrode and a second electrode, the second electrode overlapping the first electrode and extending from the second semiconductor layer.

2. The display apparatus of claim 1, further comprising:
a first insulating layer; and
a second insulating layer overlapping the first insulating layer;
wherein the first electrode of the capacitor and the first gate electrode both contact both the first insulating layer and the second insulating layer and are both positioned between the first insulating layer and the second insulating layer, and
wherein the second electrode of the capacitor is electrically connected to the first gate electrode.

3. The display apparatus of claim 1, further comprising:
a connection electrode contacting a face of the first gate electrode and contacting a face of the second electrode of the capacitor, wherein the face of the first gate electrode and the face of the second electrode of the capacitor face a same direction.

4. The display apparatus of claim 1, further comprising:
a third transistor comprising a third semiconductor layer, comprising a third gate electrode insulated from the third semiconductor layer, and configured to transmit a data signal to the first transistor, the third semiconductor layer comprising a second silicon semiconductor; and
a first signal line electrically connected to the third gate electrode.

5. The display apparatus of claim 4, wherein the first electrode of the capacitor is electrically connected to the first signal line.

6. The display apparatus of claim 4, wherein the first electrode of the capacitor comprises a protruding portion of the first signal line.

7. The display apparatus of claim 4, further comprising:
a fourth transistor comprising a fourth semiconductor layer, comprising a fourth gate electrode insulated from the fourth semiconductor layer, and electrically connected to the first gate electrode and the first semiconductor layer, the fourth semiconductor layer comprising a second oxide semiconductor; and
a second signal line electrically connected to the fourth gate electrode.

8. The display apparatus of claim 7, wherein the first signal line and the second signal line are apart from each other in a first direction, and
wherein the first transistor is between the first signal line and the second signal line in a plan view of the display apparatus.

9. The display apparatus of claim 7, wherein the first signal line and the second signal line respectively contact different insulating layers.

10. The display apparatus of claim 7, wherein the fourth semiconductor layer is electrically connected to both the first gate electrode and the second electrode of the capacitor.

11. The display apparatus of claim 4, further comprising:
a fifth transistor comprising a fifth semiconductor layer and a fifth gate electrode insulated from the fifth semiconductor layer, wherein the fifth semiconductor layer comprises a third silicon semiconductor, and wherein the fifth gate electrode is electrically connected to the first signal line.

12. The display apparatus of claim 1, wherein the second transistor is configured to apply an external voltage to the first gate electrode.

13. The display apparatus of claim 1, wherein the first gate electrode is positioned between the second semiconductor layer and the first semiconductor layer.

14. A display apparatus comprising:
a first transistor comprising a first semiconductor layer and a first gate electrode insulated from the first semiconductor layer;
a second transistor comprising a second semiconductor layer and a second gate electrode insulated from the second semiconductor layer, wherein a material of the second semiconductor layer is different from a material of the first semiconductor layer; and
a capacitor comprising a first electrode and a second electrode, wherein the second electrode overlaps the first electrode, is electrically connected to the second semiconductor layer, and comprises a first oxide semiconductor.

15. The display apparatus of claim 14, further comprising:
a connection electrode contacting both a face of the first gate electrode and a face of the second electrode of the capacitor, wherein the face of the first gate electrode and the face of the second electrode of the capacitor face a same direction.

16. The display apparatus of claim 14, wherein the first semiconductor layer comprises a silicon semiconductor, and
wherein the second semiconductor layer comprises a second oxide semiconductor, wherein a composition of the second oxide semiconductor is identical to a composition of the first oxide semiconductor.

17. The display apparatus of claim 14, further comprising:
a third transistor comprising a third semiconductor layer, comprising a third gate electrode insulated from the third semiconductor layer, and configured to transmit a data signal to the first transistor;
a first signal line electrically connected to the third gate electrode;
a fourth transistor comprising a fourth semiconductor layer, comprising a fourth gate electrode insulated from the fourth semiconductor layer, and electrically connected to both the first gate electrode and the first semiconductor layer; and
a second signal line electrically connected to the fourth gate electrode.

18. The display apparatus of claim 17, wherein the first signal line and the second signal line are apart from each other in a first direction, and
wherein the first transistor is between the first signal line and the second signal line in a plan view of the display apparatus.

19. The display apparatus of claim 17, further comprising:
a fifth transistor comprising a fifth semiconductor layer and a fifth gate electrode insulated from the fifth semiconductor layer, wherein the fifth gate electrode is electrically connected to the first signal line.

20. The display apparatus of claim 19, wherein the fifth semiconductor layer comprises a silicon semiconductor.

* * * * *